United States Patent [19]
Ojha et al.

[11] Patent Number: 4,886,569
[45] Date of Patent: Dec. 12, 1989

[54] PLASMA ETCHING PROCESS

[75] Inventors: Sureshchandra M. Ojha, Harlow; Stephen R. Jennings, Bishop's Stortford; Anthony D. Johnston, Harpenden, all of Great Britain

[73] Assignee: STC PLC, London, England

[21] Appl. No.: 313,377

[22] Filed: Feb. 21, 1989

[30] Foreign Application Priority Data

Feb. 20, 1988 [GB] United Kingdom ............... 8803996

[51] Int. Cl.$^4$ ...................... H01L 21/306; B44C 1/22; C03C 15/00; C03C 25/06
[52] U.S. Cl. ..................................... 156/643; 156/646; 156/651; 156/657; 156/659.1; 156/662; 204/192.37; 252/79.1; 437/233
[58] Field of Search ............... 252/79.1; 156/643, 646, 156/651, 652, 657, 659.1, 662; 204/192.32, 192.37; 437/233; 357/59

[56] References Cited

U.S. PATENT DOCUMENTS 4,457,820 7/1984 Bergeron et al. ............... 156/651 X
4,528,066 7/1985 Merkling et al. ............... 156/651 X Primary Examiner—William A. Powell
Attorney, Agent, or Firm—Lee, Mann, Smith, McWilliams & Sweeney

[57] ABSTRACT

A polysilicon layer or a single crystal silicon substrate is plasma etched in a two staged process. The first stage was a non-selective anisotropic etch to define a desired pattern by etching part way through the polysilicon. The second stage was a selective etch to secure remaining polysilicon and expose the substrate.

4 Claims, 1 Drawing Sheet

PLASMA ETCHING PROCESS

This invention relates to plasma or dry etching process, and in particular to a plasma etching process for the treatment of polycrystalline silicon (polysilicon).

BACKGROUND OF THE INVENTION

A recent development in semiconductor technology is the introduction of devices incorporating both field effect transistors and bipolar transistors on a common single crystal silicon substrate. A particularly advantageous form of this technology employs polysilicon for the formation of field effect transistor gates and bipolar transistor emitters. Devices incorporating those features are described for example in our published specification No. 2,173,638 (P. D. Scovell et al 15-13-8). The use of polysilicon for this purpose requires the use of a selective etching process that will selectively remove polysilicon without significant attack of the underlying single crystal silicon. The etchant materials currently employed for this purpose have only a moderate selectivity. In addition, the isotropic etching characteristics of the materials currently used causes significant undercut of the polysilicon. This is clearly undesirable as it limits the accuracy with which circuit features may be defined and in turn limits the packing density of devices on the chip. A further disadvantage of conventional etchants is that they function by reactive ion etching (RIE). This results in radiation damage of devices formed in the single crystal substrate.

The object of the invention is to minimise or to overcome these disadvantages.

SUMMARY OF THE INVENTION

According to the invention there is provided a process for selectively etching a polysilicon layer provided on a single crystal silicon substrate, the method including exposing selected regions of the polysilicon layer to a first non-selective anisotropic plasma so as to etch said regions but without exposing the substrate, and exposing said selected regions to a second selective isotropic plasma whereby the remaining polysilicon is removed from said regions.

According to the invention there is further provided, a process for selectively etching a polysilicn layer provided on a single crystal substrate, the method including masking the layer, exposing the unmasked regions of the layer to a first non-selective anisotropic plasma etch comprising sulphur hexafluoride or a mixture of sulphur hexfluoride ($SF_6$) containing at least 20 volume percent of oxygen whereby a major portion of exposed polysilicon is removed, exposing the structure to a second selective isotropic plasma etch comprising sulphur hexafluoride containing a trace quantity of oxygen whereby the remaining polysilicon is removed without significant attack of the single crystal substrate.

An exposure of the structure to an isotropic etch is restricted to the final stages of etching, there is very little undercut of the polysilicon layer.

We have found that a plasma comprising sulphur hexafluoride displays a significant degree of selectivity between polycrystalline and single crystal silicon, whilst a plasma comprising a mixture of sulphur hexofluoride and at least 20 percent oxygen display a high degree of anistropy. By performing the major portion of the etching process with an anistropic plasma, the problems of undercut is avoided. The remainder of the polysilicon is then etched with the selective isotropic plasma without significant risk of damage to the underlying substrate.

BRIEF DESCRIPTION OF THE DRAWINGS

An embodiment of the invention will now be described with reference to the accompanying drawings in which.

DESCRIPTION OF PREFERRED EMBODIMENTS

Figure 1:
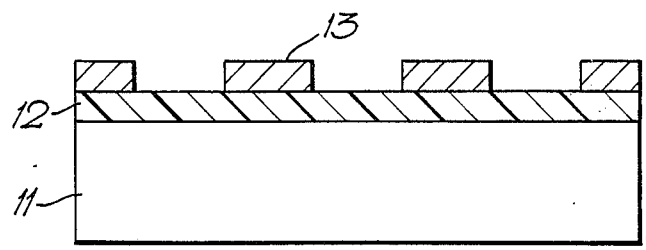
FIGS. 1 to 3 illustrate successive stages in the formation of a polysilicon pattern on a single crystal substrate.
Figure 2:
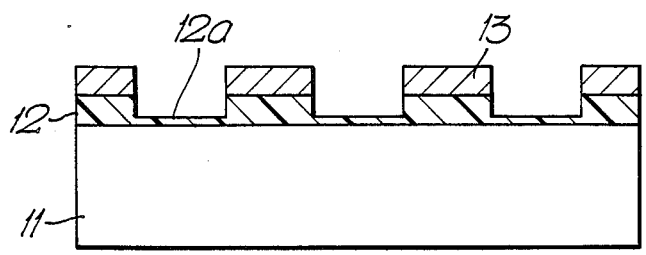

Referring to the drawings, a single crystal silicon substrate 11 (FIG. 1) is provided with a surface layer 12 of polycrystalline silicon (polysilicon). A photolithographic mask 13 is applied to the polysilicon layer and the structure is exposed to a radio frequency plasma comprising a mixture of sulphir hexafluoride and oxygen. This provides anisotropic ecthing of the exposed polysilicon down towards the substrate. Most of the polysilicon is removed from the exposed regions leaving only a thin layer 12a (FIG. 2) in those regions. As this process is anisotropic there is substantially no undercut of the unexposed polysilicon regions. Thus, the device features can be accurately defined.

Typically we employ 20 to 40 volume percent of oxygen, and preferably 25 percent of oxygen, in the gas mixtures. Etching may be performed at pressures of 0.4 to 1.0 torr.

The anisotropic etching process is followed by a second selective isotropic etching process. The partially etched structure is exposed to a radio frequency plasma comprising pure sulphur hexafluoride or sulphur containing trace quantities of oxygen. The oxygen concentration in this isotropic plasma should not exceed 5 volume percent.

Figure 3:
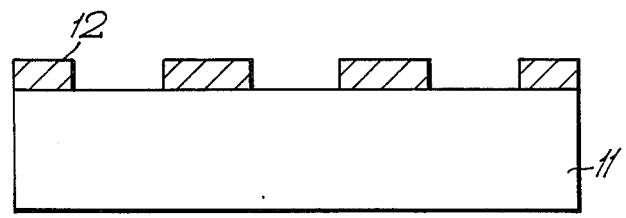

This plasma removes the remaining polysilicon from the exposed regions to form the structure shown in FIG. 3. As this etch is selective, there is very little attack of the substrate. In particular, we have found a sulphur hexafluoride plasma at a pressure of 2 torr has a selectivity between polysilicon and single crystal silicon of about 5:1. The etch rate of polysilicon under these conditions is 215A/min whilst that of single crystal silicon is only 42A/min. Typically we employ pressures of 0.8 to 3.0 torr. After completion of the second etching stage the mask 13 is removed and the structure of FIG. 3 may then be further processed to form a finished device.

Of the two etching stages, only the first stage displays significant ion etching. During this first stage the substrate is protected from radiation damage by the remaining polysilicon. The first stage ensures accurate defination of the polysilicon pattern whilst the second stage is required to remove only a thin silicon layer and thus displays no significant undercutting of the polysilicon pattern.

The following Example illustrates the invention.

EXAMPLE

A single crystal silicon wafer was provided with a surface coating of polysilicon 7,500A (750 nm) in thickness. The polysilicon was provided with a photolithographic mask and was then anisotropically etched in a plasma containing sulphur hexafluoride and oxygen under the following conditions:

| | |
|---|---|
| Pressure | 0.450 torr |
| SF$_6$ flowrate | 135 scc/min |
| O$_2$ flowrate | 61 scc/min |
| Generator frequency | 13.56 MHz |
| Generator power | 100 watts |
| Wafer area | 88 cm$^2$ |
| Etch time | 36 seconds |
| Etch depth | 4000 A (400nm) |

The partially etched wafer was then exposed to a plasma containing pure sulphur hexafluoride to effect isotropic selective etching of the remaining polysilicon. The etching conditions were as follows:

| | |
|---|---|
| Pressure | 2.0 torr |
| SF$_6$ Flow rate | 90 scc/min |
| Generator frequency | 13.56 MHz |
| Generator power | 60 watt |
| Etch time | 16.5 min |
| Etch depth | 3500 A (350nm) |

Examination of the wafer after completion of the second etching stage revealed substantially no undercutting and substantially no erosion of the underlying substrate. This Example demonstrates the feasibility of the etching process described above.

In the above Example the gas flow rates have been expressed in standard cc/minute, i.e. the gas flow rates are reduced to equivalent flow rates at atmospheric pressure.

Whilst the above process has been described with particular reference to devices incorporating both bipolar and field effect transistors, it is not of course limited to this application but may be generally employed in semiconductor fabrication.

We claim:

1. A process for selectively etching a polysilicon layer provided on a single crystal substrate, the method including masking the layer, exposing the unmasked regions of the layer to a first non-selective anisotropic plasma etch comprising sulphur hexafluoride (SF$_6$) containing at least 20 volume percent of oxygen whereby a major portion of exposed polysilicon is removed, exposing the structure to a second selective isotropic plasma etch comprising sulphur hexafluoride or a mixture of sulphur hexafluoride and a trace quantity of oxygen whereby the remaining polysilicon is removed without significant attack of the single crystal substrate.

2. A process as claimed in claim 1, wherein said first etching stage is performed at a pressure of 0.4 to 1.0 torr.

3. A process as claimed in claim 2 wherein the second etching stage is performed at a pressure of 0.8 to 3.0 torr.

4. A process as claimed in claim 3 wherein the substrate comprises an integrated circuit incorporating both bipolar and field effect transistors.

* * * * *